(12) United States Patent
Sadd et al.

(10) Patent No.: US 6,444,545 B1
(45) Date of Patent: Sep. 3, 2002

(54) DEVICE STRUCTURE FOR STORING CHARGE AND METHOD THEREFORE

(75) Inventors: Michael A. Sadd; Sucharita Madhukar; Frank Kelsey Baker, all of Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/740,249

(22) Filed: Dec. 19, 2000

(51) Int. Cl.$^7$ ................................................ H01L 21/20
(52) U.S. Cl. ........................................ 438/503; 438/257
(58) Field of Search ........................... 438/97, 197, 211, 438/257, 263–266, 680, 165–166, 491, 594, 770, 775, 90, 503, 507, 509, 201, 288; 257/321; 117/935–936

(56) References Cited

U.S. PATENT DOCUMENTS

| | | | |
|---|---|---|---|
| 3,878,549 A | 4/1975 | Yamazaki et al. ............. | 357/23 |
| 6,297,095 B1 * | 10/2001 | Muralidhar et al. ........ | 438/197 |
| 6,344,403 B1 * | 2/2002 | Madhukar et al. .......... | 117/935 |

OTHER PUBLICATIONS

Ilgweon Kim et al, "Room Temperature Single Electron Effects in a Si Nano–Crystal Memory", Dec. 1999 IEEE Electron Device Letters, vol. 20, No. 12, pp. 630–631.

Ilgweon Kim et al., "Room Temperature Single Electron Effects in Si Quantum Dot Memory with Oxide–Nitride Tunneling Dielectrics", 1988 IEEE, 4 pages.

Yang (Larry) Yang et al., "Reliability considerations in scaled SONOS nonvolatile memory devices", Solid–State Electronics 43 (1999), pp. 2025–2032.

\* cited by examiner

Primary Examiner—David Nelms
Assistant Examiner—David Vu
(74) Attorney, Agent, or Firm—Kim-Marie Vo; James L. Clingan, Jr.

(57) ABSTRACT

A semiconductor device structure for storing charge has a silicon nitride layer, in which a plurality of nanoclusters are sandwiched between oxide layers. The nanoclusters and the silicon nitride make up a storage region, which is particularly useful in non-volatile memories. The nanoclusters provide a repository for holes or electrons that jump from trap to trap in the silicon nitride when the silicon nitride is heated. This results in much of the charge, which would normally leak off from the silicon nitride at high temperatures, remaining in the storage region due to trapping in the nanoclusters. The silicon nitride layer with nanoclusters therein is formed by depositing a silicon nitride layer, then nanoclusters, and then another silicon nitride layer or by depositing a silicon-rich silicon nitride layer and subsequent heating to cause it to transform to a regular silicon nitride layer with silicon nanoclusters therein.

11 Claims, 4 Drawing Sheets

DEVICE STRUCTURE FOR STORING CHARGE AND METHOD THEREFORE

FIELD OF THE INVENTION

The invention relates generally to semiconductor devices and more particularly to a semiconductor storage device and a process for forming such a semiconductor storage device.

RELATED ART

Electrically erasable programmable read only memory (EEPROM) structures are commonly used in integrated circuits for non-volatile data storage. As is known, EEPROM device structures commonly include a floating gate that has charge storage capabilities. Charge can be forced into the floating gate structure or removed from the floating gate structure using control voltages. The conductivity of the channel underlying the floating gate is significantly altered by the presence of charges stored in the floating gate. The difference in conductivity due to a charged or uncharged floating gate can be current sensed, thus allowing binary memory states to be determined. The conductivity difference is also represented by a shift in the threshold voltage (Vt) associated with the device in the two different states.

As semiconductor devices continue to evolve, the operating voltages of such semiconductor devices are often reduced in order to suit low power applications. It is desirable for such operating voltage reductions to be accomplished while ensuring that the speed and functionality of the devices is maintained or improved.

One EEPROM device, which operates at lower operating voltages than a continuous floating gate device, uses a silicon-oxide-nitride-oxide-silicon (SONOS) structure, in which charge is stored in the nitride layer. Another advantage of SONOS over the continuous floating gate device is the ease of processing due to its simpler layer structure. In a SONOS structure, charge is forced from the substrate through the tunnel oxide into the nitride, which acts as a trapping layer. The trapping layer in SONOS is equivalent to the floating gate of other EEPROM devices. One problem that exists with the SONOS structure is that at temperatures greater than or equal to room temperature, the charge retention of the trapping layer can be a problem. The energy levels of the nitride traps are not deep enough to prevent, over the expected lifetime of the device, charge from thermally exciting into the nitride conduction band, then tunneling to the substrate layer through the first oxide (tunnel oxide). Hence, the charge retention and reliability of this structure is diminished. Therefore a need exists for a SONOS structure with a higher reliability, especially at temperatures equal to or greater than room temperature.

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

Generally, the present invention pertains to a semiconductor memory device with a trapping layer that includes a plurality of nanoclusters or discrete storage elements and techniques useful in the manufacturing of such a device. By including a plurality of nanoclusters in the trapping layer of traditional SONOS, there is an improvement in charge retention, reliability characteristics and write/erase times. (As used herein, the term "traditional SONOS" is used to define the SONOS structure without nanoclusters.) In one embodiment, the nanoclusters are deposited on a nitride layer. In another embodiment, the nanoclusters are nucleated from the nitride layer. The invention can be better understood with references to FIGS. 1–10.

Figure 1:
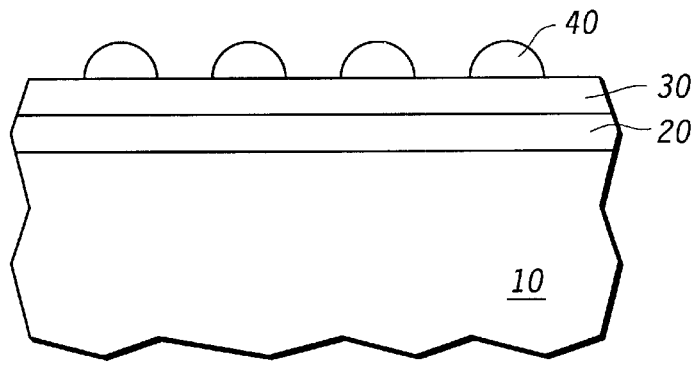
FIGS. 1–4 illustrate a cross-sectional view of an improved SONOS structure according to the present invention.

Turning to FIG. 1, the improved SONOS device is formed on a substrate 10. Substrate 10 typically is a single crystal silicon or other semiconductive material, such as GaAs. Alternatively, substrate 10 may be a silicon-on-insulator (SOI). In each case, a top surface of substrate 10 will be a semiconductor material. Over substrate 10 a tunnel oxide layer or first oxide layer 20 is formed. Typically, first oxide layer 20 is $SiO_2$. First oxide layer 20 can also be aluminum oxide, nitrided $SiO_2$, any other dielectric material or tunneling barrier material. First oxide layer 20 is typically formed by thermal growth. However, any other known method for forming dielectric materials can be used, such as CVD, PVD, combinations thereof, or the like. A first nitride layer 30 is formed over first oxide layer 20. Typically, first nitride layer 30 is deposited by using CVD, PVD, combinations thereof and the like. First nitride layer 30 is typically silicon nitride. First nitride layer 30 preferably has a thickness less than 50 Angstroms. Nanoclusters 40 are formed on first nitride layer 30, as shown in FIG. 1. Nanoclusters are preferably nanocrystals of silicon, however another suitable semiconductor material can be used. In addition, it is possible that the nanoclusters are amorphous. Nanoclusters 40 can be deposited through a controlled LPCVD, RTCVD or UHCVD process. Through these processes the density of nanoclusters 40 can be closely controlled. In embodiments utilizing LPCVD or RTCVD techniques a multi-step process may be utilized to ensure proper nucleation and growth selectivity for different phases of the nanocluster formation. As such, desired nanocluster densities can be achieved while ensuring uniformity in size and density in a manufacturable process. In embodiments where UHVCVD is utilized to grow the nanoclusters 40, additional advantages are achieved due to the reduction of background contamination in the environment within which the nanoclusters 40 formation occurs. Similar optimizations to the formation of the nanoclusters that were utilized in LPCVD techniques can be employed in UHVCVD techniques to produce the desired resulting nanoclusters 40. In UHVCVD techniques even lower pressures than those present in LPCVD techniques can provide a further reduction in growth kinetics such that a higher level control is obtained over the nanocluster formation. Furthermore, potential gradients in nanocluster growth rates due to precursor gas depletion effects are further minimized. Preferably, the nanoclusters 40 are approximately less than 100 Angstroms in the diameter. (For purposes of this specification, the nanocluster diameter is defined as the largest width of the nanocluster.) More preferably, they are approximately 35–50 Angstroms in diameter. As schematically shown in FIGS. 1–4, the nanoclusters 40 are usually approximately hemispherical in shape due to the deposition process. Thus, the nanoclusters 40, generally, have a height that is approximately half of their diameter. The density of nanoclusters 40 is at least $10^{11}$ nanoclusters per square centimeter. Using any of the above methods will result in the nanoclusters that are deposited during the same process, being substantially in the same row.

Figure 2:
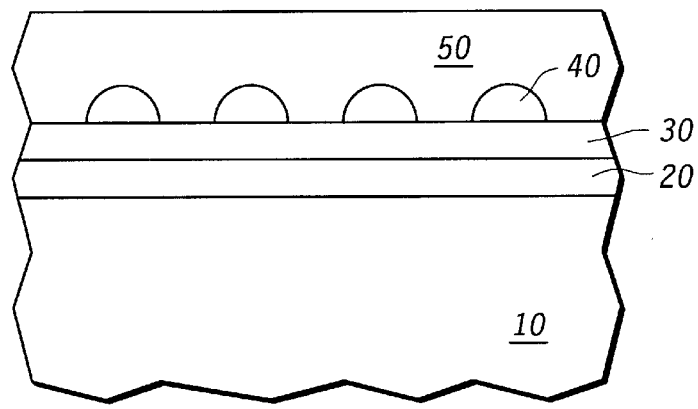

As shown in FIG. 2, a second nitride layer 50 is formed over nanoclusters 40 and the first nitride layer 30. Typically the second nitride layer 50 is silicon nitride. However, another material with a large density of isolated charge trapping centers can be used. In one embodiment, the first and second nitride layers (30 and 50) are the same material. The same processes used to form the first nitride layer 30 can also be used to form the second nitride layer 50. The sum of the first nitride layer 30 and the second nitride layer 50 is less than 300 Angstroms. Preferably, the first and second nitride layers (30 and 50) are between 50 and 300 Angstroms and more preferably between 75 to 150 Angstroms. The thickness of the nitride layers (30 and 50) cannot be too thick, or else the total voltage required to write or erase the device will increase to an undesirable level. This will increase the time required to write or erase the device. The thickness of the nitride layers (30 and 50) cannot be too thin as not to allow for enough charge to be stored in structure. In one embodiment both the first nitride layer 30 and the second nitride layer 50 will be 75 Angstroms. In another embodiment, the first nitride layer 30 will be less than 50 Angstroms and preferably between 10 to 50 Angstroms. The second nitride layer 50 will be between 50 and 150 Angstroms and preferably approximately 75 Angstroms. In the embodiments where first nitride layer 30 is thinner than second nitride layer 50, the nanoclusters 40 will be closer to the tunnel oxide layer 20. This will increase the speed of writing electrons to the structure relative to the case where the second nitride layer 50 thinner than the first nitride layer 30. Charge retention, however, will be better in the latter case. To see an improvement over traditional SONOS in write and erase speeds, the first nitride layer 50 should be less than 50 to 75 Angstroms. Charge retention will still improve when the first layer is 10 to 30 Angstroms or more.

In one embodiment, after forming the second nitride layer 50, a second row of nanoclusters (not shown) would be deposited over the second row of nanoclusters. In such cases, a third nitride layer (not shown) can be formed. Further multiple layers can be formed in such a manner, if desired. However, in general it is desirable for the overall nitride thickness not to exceed about 50–300 Angstroms. The benefit of a thicker overall nitride and additional nanoclusters is increased charge storage. The disadvantage is an increase in the voltage required for program and erase.

Figure 3:
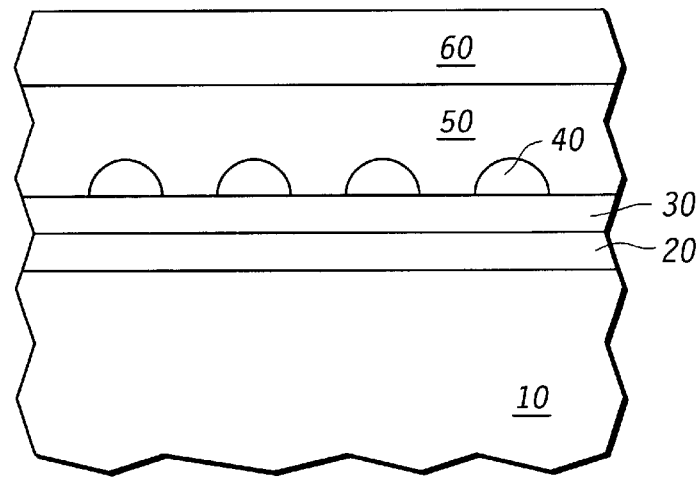

Turning to FIG. 3, the second oxide layer 60 is formed on the nitride layer 50. The second oxide layer 60 is preferably a $SiO_2$ layer, but may be any other suitable dielectric material as well, such as aluminum oxide, nitrided $SiO_2$, or a metal oxide. The second oxide layer 60 can be thermally grown or deposited by CVD, PVD, combinations thereof, or the like. First oxide layer 20 and second oxide layer 60 can be the same or different materials. Second oxide layer 60 is typically 40–50 Angstroms in thickness.

Figure 4:
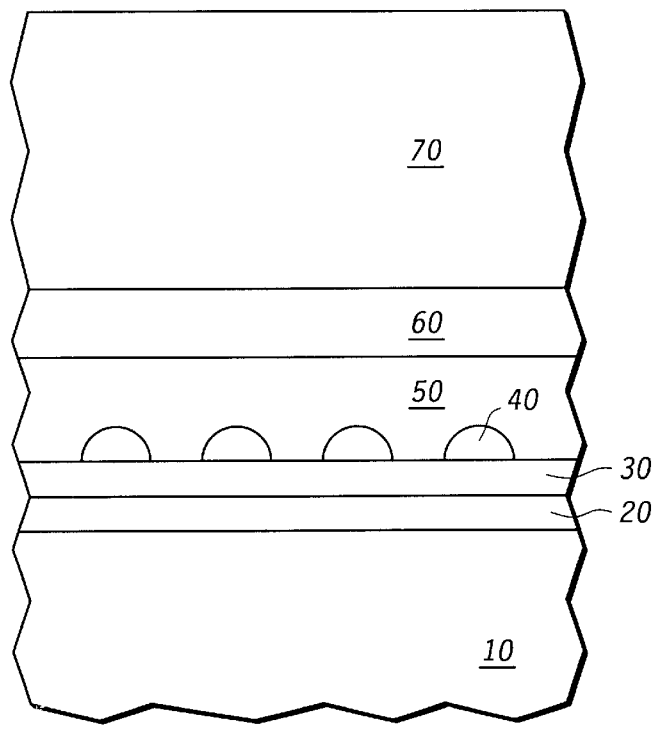

On the second oxide layer 60 a conductive layer 70 is formed, as shown in FIG. 4. Typically conductive layer 70 will be a polycrystalline silicon layer. However, any other conductive material, such as a metal, metal alloy and the like, can be used. The conductive layer 70 is typically at least 1000 Angstroms in thickness if it is polycrystalline silicon. Any known method for depositing a conductive material can be used such as CVD, PVD, combinations thereof and the like.

Figure 5:
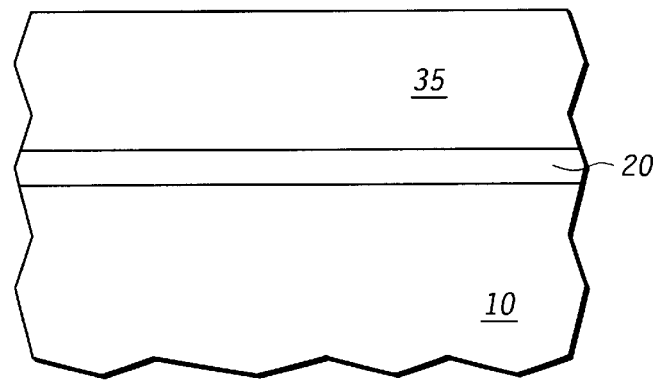
FIGS. 5–8 illustrate a cross-sectional view of an alternate embodiment of the improved SONOS structure according to the present invention.
Figure 6:
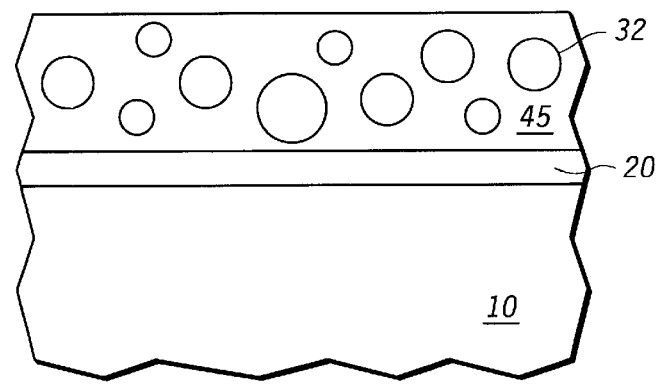

Another method for forming the improved SONOS structure will be described with references to FIGS. 5–8. In FIG. 5, the substrate 10 and the first oxide layer 20 are formed as previously discussed in the alternate embodiment. The same materials and thicknesses are used as previously discussed. Over the first oxide layer 20, a silicon-rich nitride layer 35 is formed. Preferably, the silicon-rich nitride layer 35 has a thickness between 75 to 200 Angstroms, and more preferably approximately 100 Angstroms. The silicon-rich nitride layer 35 should have at least 5% of excess silicon and preferably will have 10–20% excess silicon. Excess silicon is used herein to describe the amount of silicon that is present beyond the amount of silicon that is present in stoichiometric silicon nitride ($Si_3N_4$). Next, the silicon rich nitride layer is annealed in a thermal furnace at a temperature of approximately 600–1000 degrees Celsius. The annealing causes silicon precipitates to form in the silicon nitride layer 35. Through nucleation and growth, the precipitates will develop into approximately spherical silicon nanoclusters 32, as shown in FIG. 6. Typically the nanoclusters 32 are approximately less than 100 Angstroms in diameter. More typically they are approximately 35–50 Angstroms. The density of nanoclusters 32 is at least $10^{11}$ nanoclusters per square centimeter. Due to the processing, the nanoclusters 35 will be scattered throughout the silicon nitride layer 35 instead of forming rows as was described in the previous embodiment.

Figure 7:
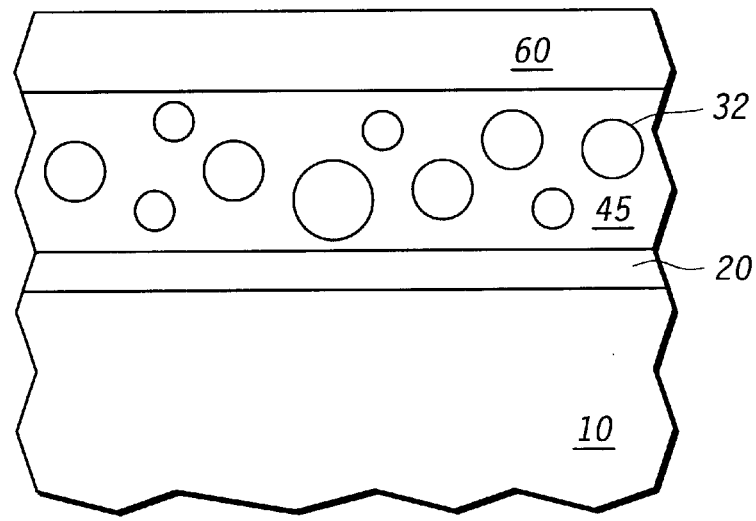
Figure 8:
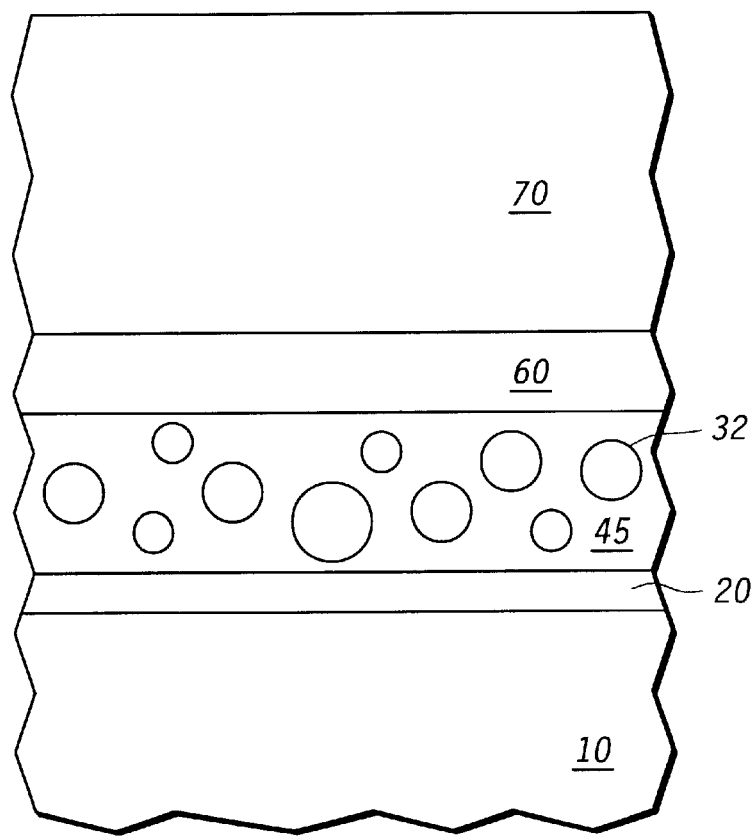

Turning to FIG. 7, the second oxide layer 60 is formed as was previously discussed in an alternate embodiment. However, the anneal previously discussed for forming the silicon precipitates does not have to be performed prior to forming the second oxide layer 60. Instead, the anneal can be performed after the formation of second oxide layer 60. As shown in FIG. 8, a conductive layer 70 is formed over second oxide layer 60.

Figure 9:
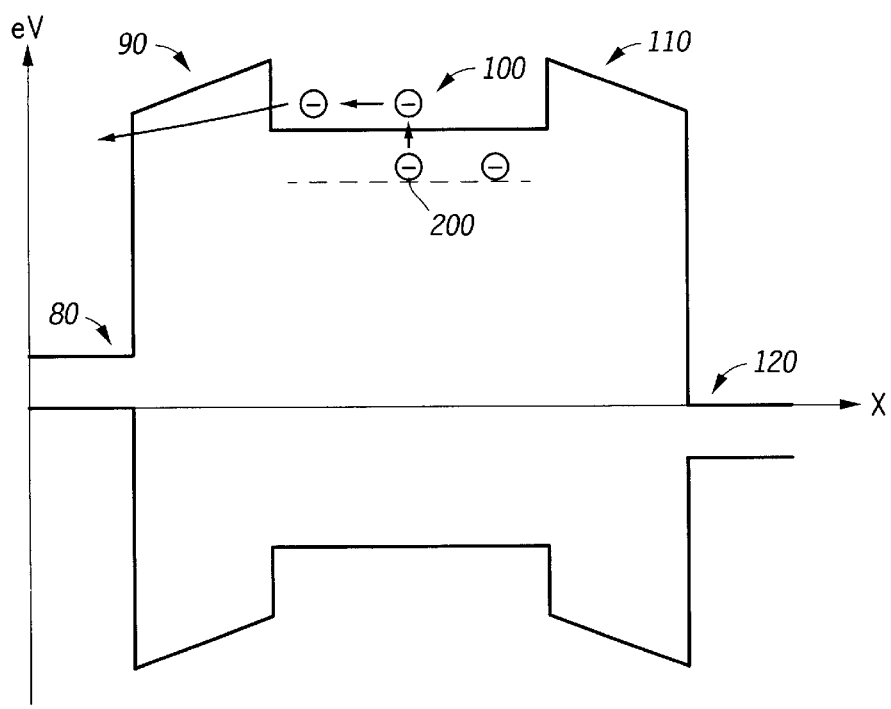
FIG. 9 illustrates a band diagram of the traditional SONOS structure during charge retention.

FIG. 9 shows an energy band diagram of the traditional SONOS structure. Element 80 is the substrate. Element 90 is the first oxide layer. Element 100 is the nitride layer. Element 110 is the second oxide layer and element 120 is the gate or conductive material. This figure shows the SONOS structure in the high $V_t$ state. The high $V_t$ state is the state of the device after electrons have been trapped in the nitride layer. The x-axis is the distance along the SONOS stack from within the silicon substrate. The y-axis is an energy level expressed in electron volts (eV). Electron 200 is in a trap level or trap state in the nitride layer 100. This trapping level is at a lower energy level than the conduction band of the nitride 100. If electron 200 is thermally excited, the electron may move from one trap state to another trap state, which is at the same energy level. However, more typically, the electron 200 will move from the trapping level to the conduction band of the nitride layer when thermally excited. The electron can then travel to the nitride 100 and first oxide layer 90 interface. The electron 200 can then tunnel through the first oxide layer 90 to the substrate layer 80. This tunneling phenomenon in the SONOS structure is undesirable because it reduces the reliability and charge retention of the device.

Figure 10:
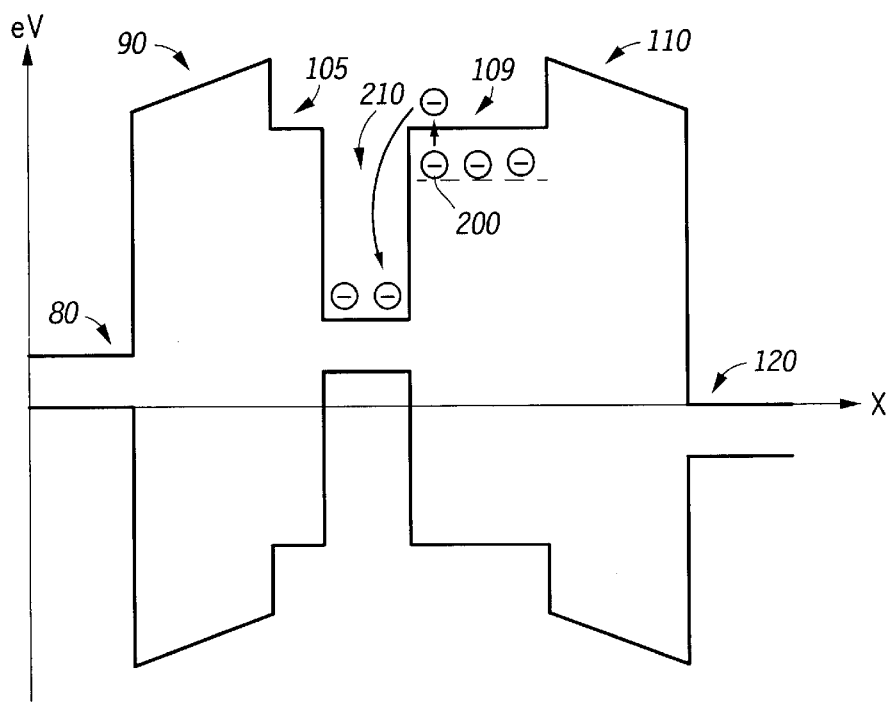
FIG. 10 illustrates a band diagram of the improved SONOS structure according to the present invention during charge retention.

FIG. 10 is an energy band diagram of the improved SONOS structure. Like the traditional SONOS energy band diagram in FIG. 9, there is a substrate layer 80, a first oxide layer 90, a second oxide layer 110 and a gate or conductive layer 120. However, in FIG. 10 there are two nitride layers. The first nitride layer 105 is below the nanoclusters in the SONOS stack and second nitride layer 109 is above the nanoclusters 210 in the SONOS stack. When thermally excited, electron 200 may tunnel from trap to trap in either nitride layer 109 or 105. More typically, electron 200, when thermally excited, will travel from the trap levels in the nitride layers 105 or 109 to the conduction bands of the nitride layers 105 and 109. Due to scattering in the nitride, the electron 200 may lose energy, then fall into a nanocluster 210. Because of the depth of the energy well introduced by the nanocluster, the rate of thermal activation into the conduction band is greatly reduced in comparison to the traditional structure in FIG. 9. Hence, the charge retention and reliability of the improved SONOS structure is superior to the traditional SONOS structure.

FIGS. 9 and 10 explain the charge retention characteristics of the SONOS structure and improved SONOS structure in regards to electrons. However, skilled artisans would appreciate that the same processes can be shown in regards to holes. However, the explanation will be with respect to the valence band of the SONOS stacks, as opposed to the conduction band as described above.

The improved SONOS stack also has the advantage of improving the process of writing holes, which will be referred to as erasing. During erasing, the traditional SONOS stack has the disadvantage that the excess of positive charge over negative charge that can be stored in the trapping layer is limited by the electron injection from the gate electrode. This problem is solved by the improved SONOS structure. When erasing with the improved SONOS structure, nanoclusters near the interface act as intermediate states. In the improved SONOS structure, the intermediate states increase the tunneling rate of holes from the substrate with respect to the tunneling rate of electrons from the conductive layer in comparison to these same relative rates in the traditional SONOS structure. This improved hole tunneling rate with respect to electron tunneling rate is due to the increase in the number of allowed states in the SONOS structure caused by the presence of nanoclusters. This improvement is also due to better energy alignment of the band diagram of the materials in the SONOS stack. Due to the increase in allowed energy states, the rate of writing holes to the improved SONOS stack is increased compared to the traditional SONOS stack under the same bias conditions. Alternately, the voltage can be decreased during erasing and this will keep the speed unchanged between traditional and improved SONOS stacks. The increase in allowed energy states also improves the write or writing of electron speed in the improved SONOS stack. Alternately, the advantage of decreasing the voltage for writing electrons in the improved SONOS stack can be performed.

Although writing, erasing and charge retention has been described with respect to a specific charge types (electrons/holes), skilled artisans appreciated that writing, erasing and charge retention can be expressed in terms of the other charge type (electrons/holes) instead.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for making a semiconductor device structure for storing charge, comprising:

providing a substrate having a semiconductor surface;

forming a first silicon oxide layer over the semiconductor surface;

forming a silicon-rich silicon nitride layer over the first silicon oxide layer;

heating the silicon-rich silicon nitride layer to form nanoclusters;

forming a second silicon oxide layer after forming the silicon-rich silicon nitride layer;

forming a silicon nitride layer over the second silicon oxide layer; and forming a conductive layer over the second silicon oxide layer.

2. The method of claim 1, wherein the conductive layer is polysilicon.

3. The method of claim 2, wherein the silicon-rich silicon nitride layer has a thickness of about 75–200 Angstroms.

4. The method of claim 3, wherein the first silicon oxide layer is thinner than the second silicon oxide layer.

5. The method of claim 1, wherein the first silicon oxide layer has a thickness of about 25 Angstroms.

6. The method of claim 1, wherein the silicon-rich silicon nitride layer has a percentage of excess silicon of at least 5 per cent.

7. The method of claim 6, wherein the percentage of excess silicon is about 10–20 per cent.

8. A method of making a charge storage device comprising:

providing a substrate;

forming a first silicon nitride layer over the substrate;

forming a first silicon oxide layer, wherein the first silicon nitride layer is over the first silicon oxide layer;

forming nanoclusters on the first silicon nitride layer;

forming a second silicon nitride layer on the nanoclusters;

forming a second silicon oxide layer over the second silicon nitride layer; and forming a conductive layer over the second silicon oxide layer.

9. The method of claim 8, wherein the first silicon nitride layer has a thickness less than 50 Angstroms.

10. The method of claim 9, wherein the second silicon nitride layer has thickness of about 75 Angstroms.

11. The method of claim 8, wherein the nanoclusters are less than 100 Angstroms in diameter.

\* \* \* \* \*